United States Patent
Manolescu

[19]

[11] Patent Number: 6,154,086
[45] Date of Patent: Nov. 28, 2000

[54] LOW RIPPLE POWER DISTRIBUTION SYSTEM

[75] Inventor: Mihai C. Manolescu, San Jose, Calif.

[73] Assignee: Zilog, Inc., Campbell, Calif.

[21] Appl. No.: 09/374,376

[22] Filed: Aug. 13, 1999

[51] Int. Cl.[7] .................................................. H03K 17/56
[52] U.S. Cl. .......................... 327/419; 327/108; 327/384; 327/546; 307/125; 307/130
[58] Field of Search ............................ 327/419, 427–435, 327/437, 384, 389, 546; 307/125, 130

[56] References Cited

U.S. PATENT DOCUMENTS 5,952,740  9/1999  Maeda et al. ............................ 307/130

FOREIGN PATENT DOCUMENTS 08023578  1/1996  Japan .

*Primary Examiner*—Terry D. Cunningham
*Assistant Examiner*—Quan Tra
*Attorney, Agent, or Firm*—Majestic, Parsons, Siebert & Hsue

[57] ABSTRACT

An apparatus having a power supply terminal, a capacitor terminal, and a load terminal for distributing power from the power supply terminal to the capacitor terminal. The apparatus has a driver which supplies load current to the load terminal in response to a control signal, a controller which generates the control signal, and is coupled to the capacitor terminal, and a switching device. The switching device couples the power supply terminal to the controller and the capacitor terminal when the driver does not supply the load current to the load terminal, and decouples the power supply terminal from the controller and the capacitor terminal when the driver supplies the load current to the load terminal. As a result, the controller is effectively isolated from the noisy power supply.

18 Claims, 7 Drawing Sheets

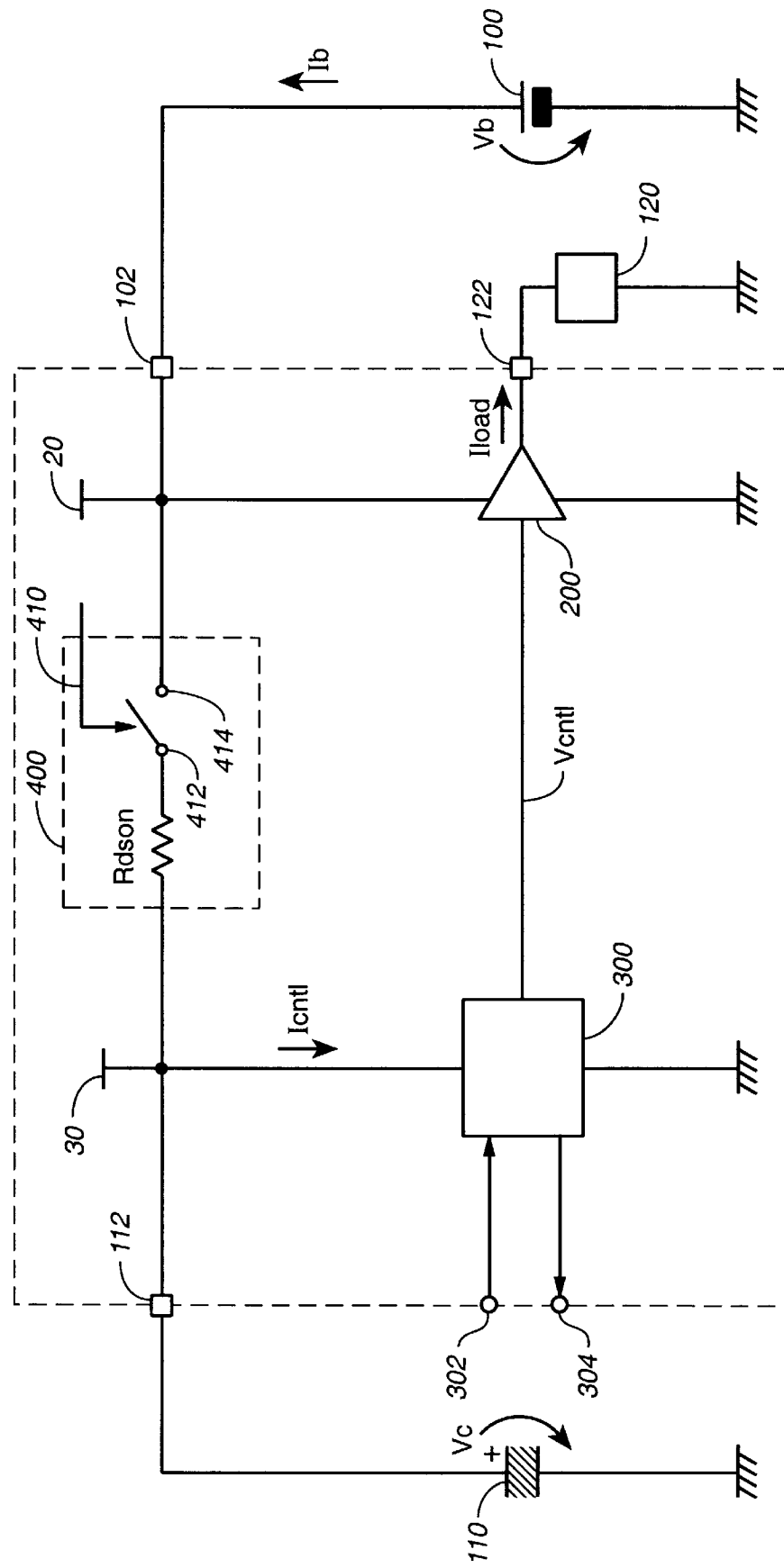
FIG._1

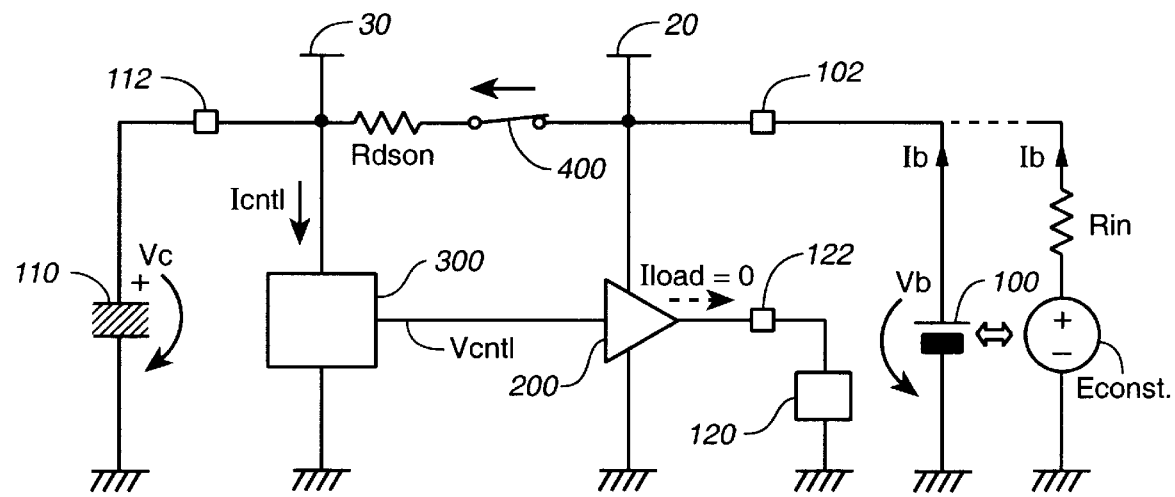
FIG._2
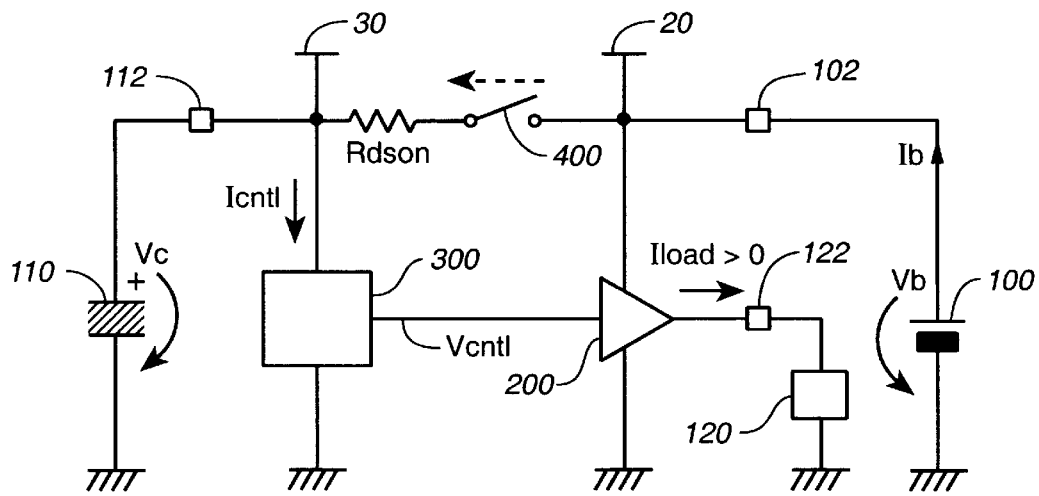
FIG._3

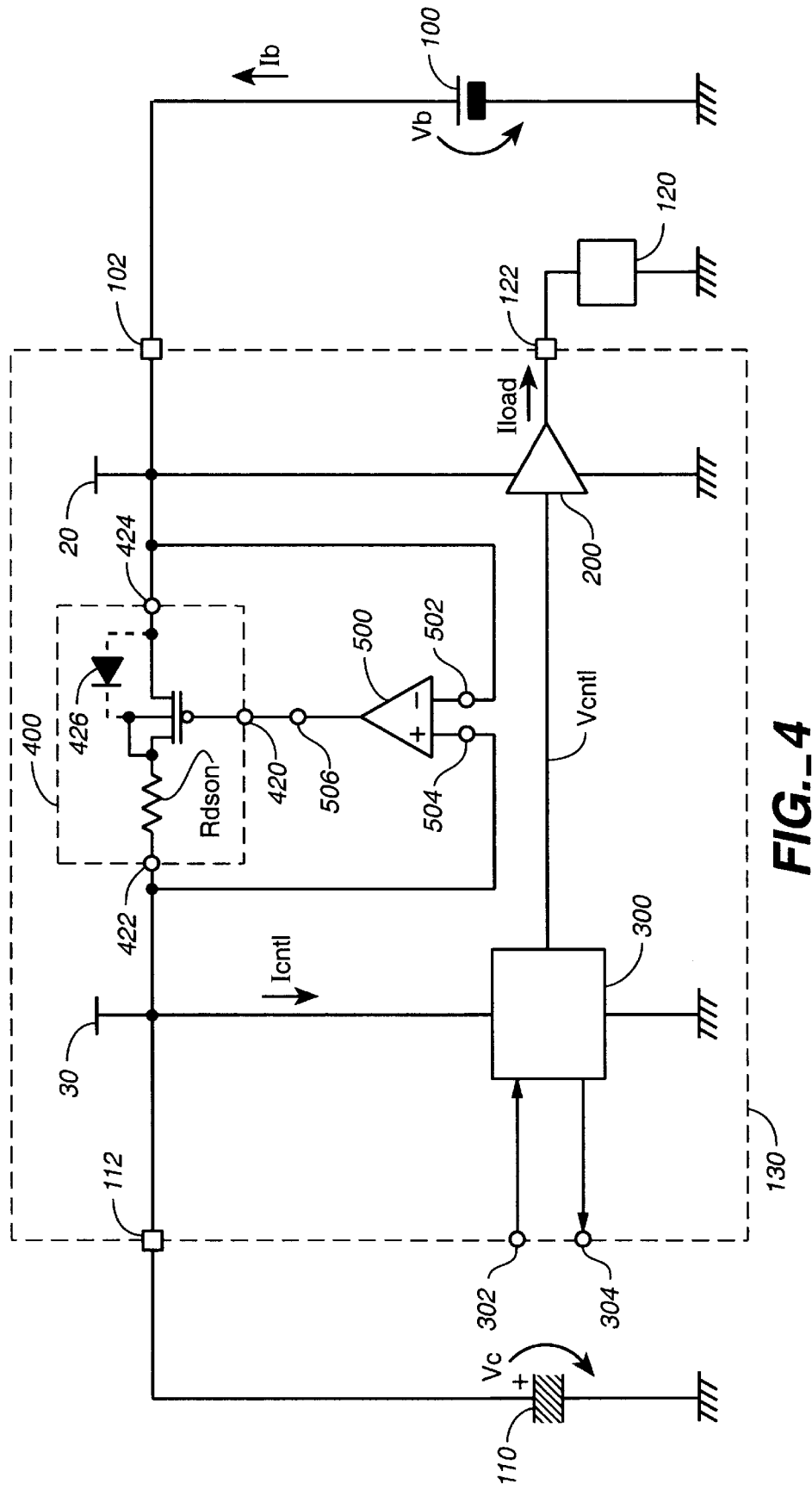
FIG._4

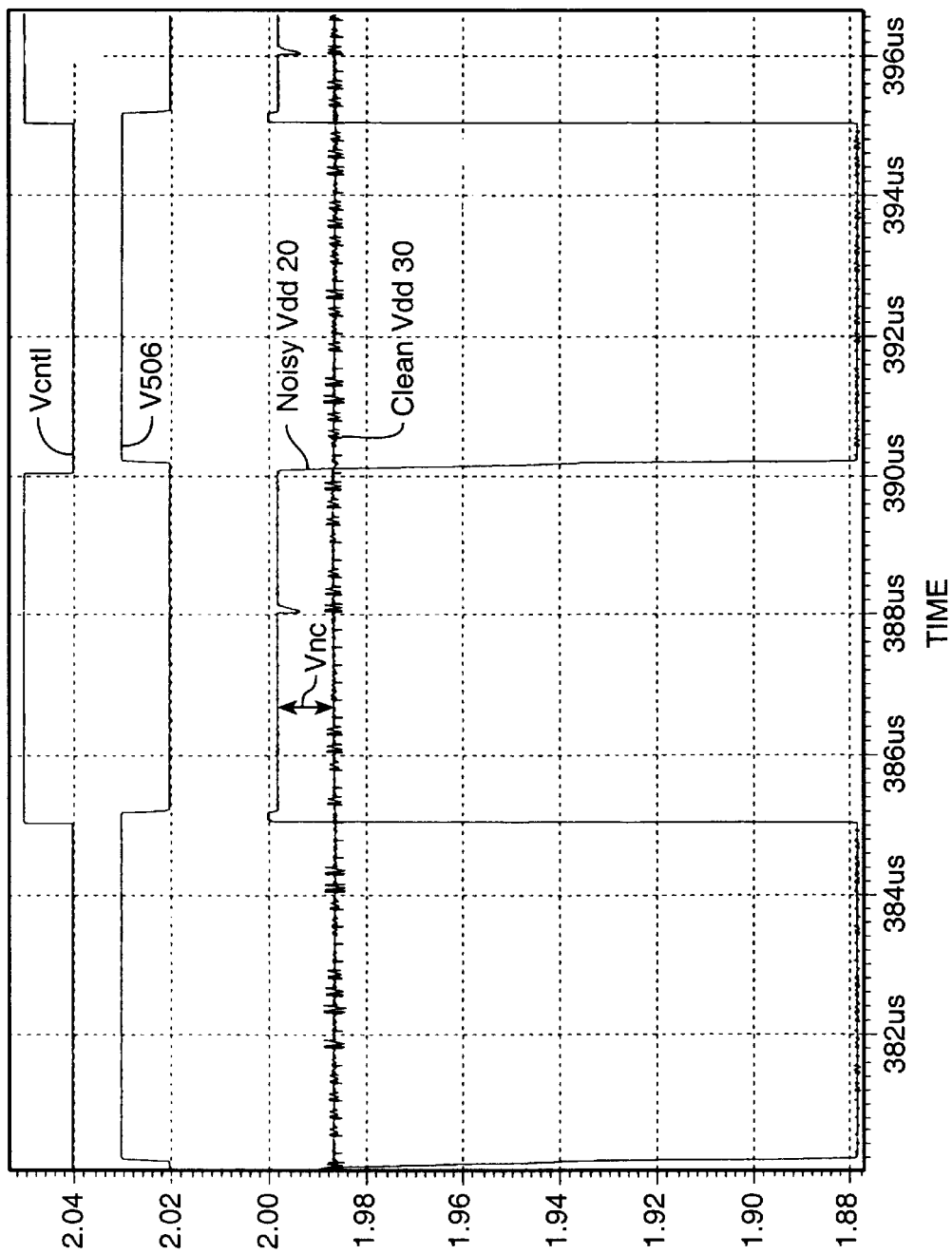
FIG._5

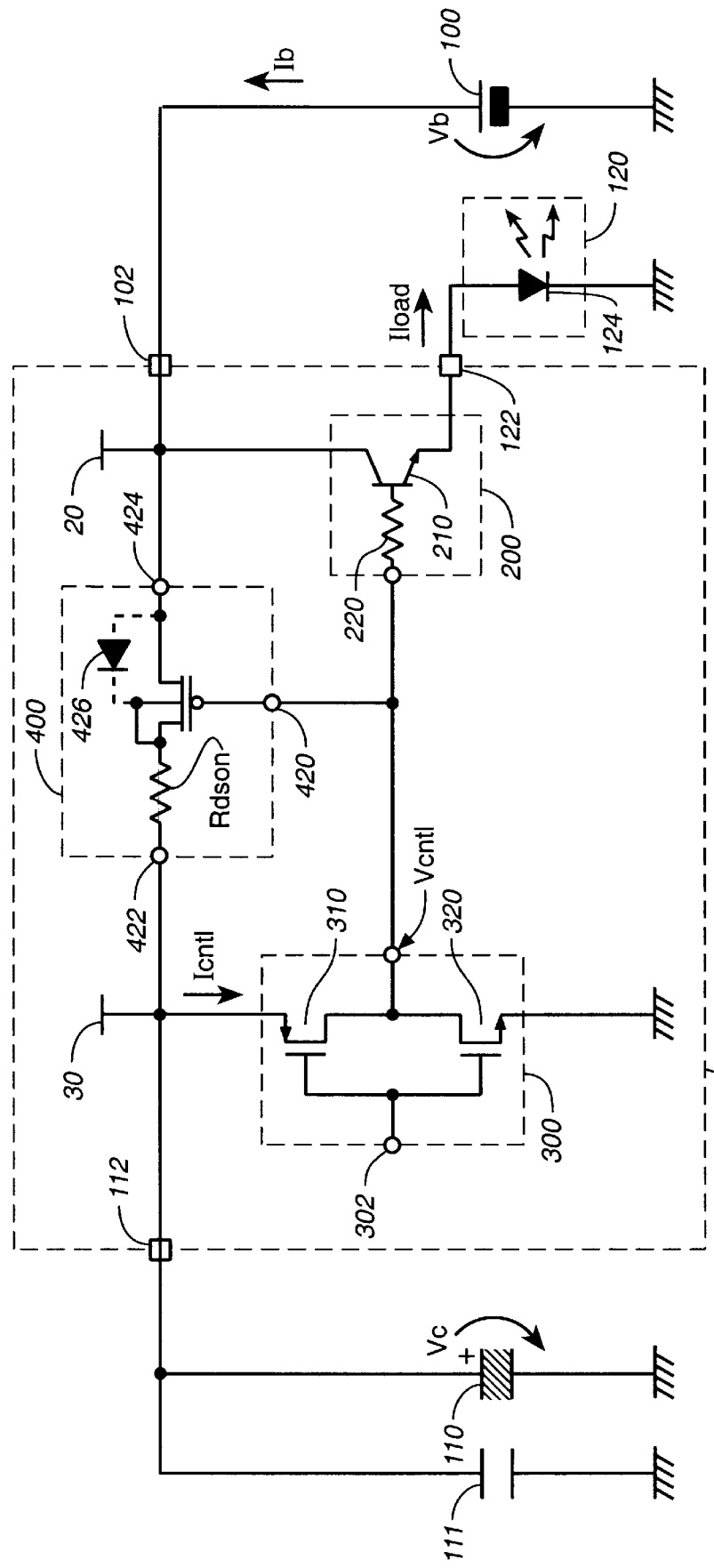
FIG._6

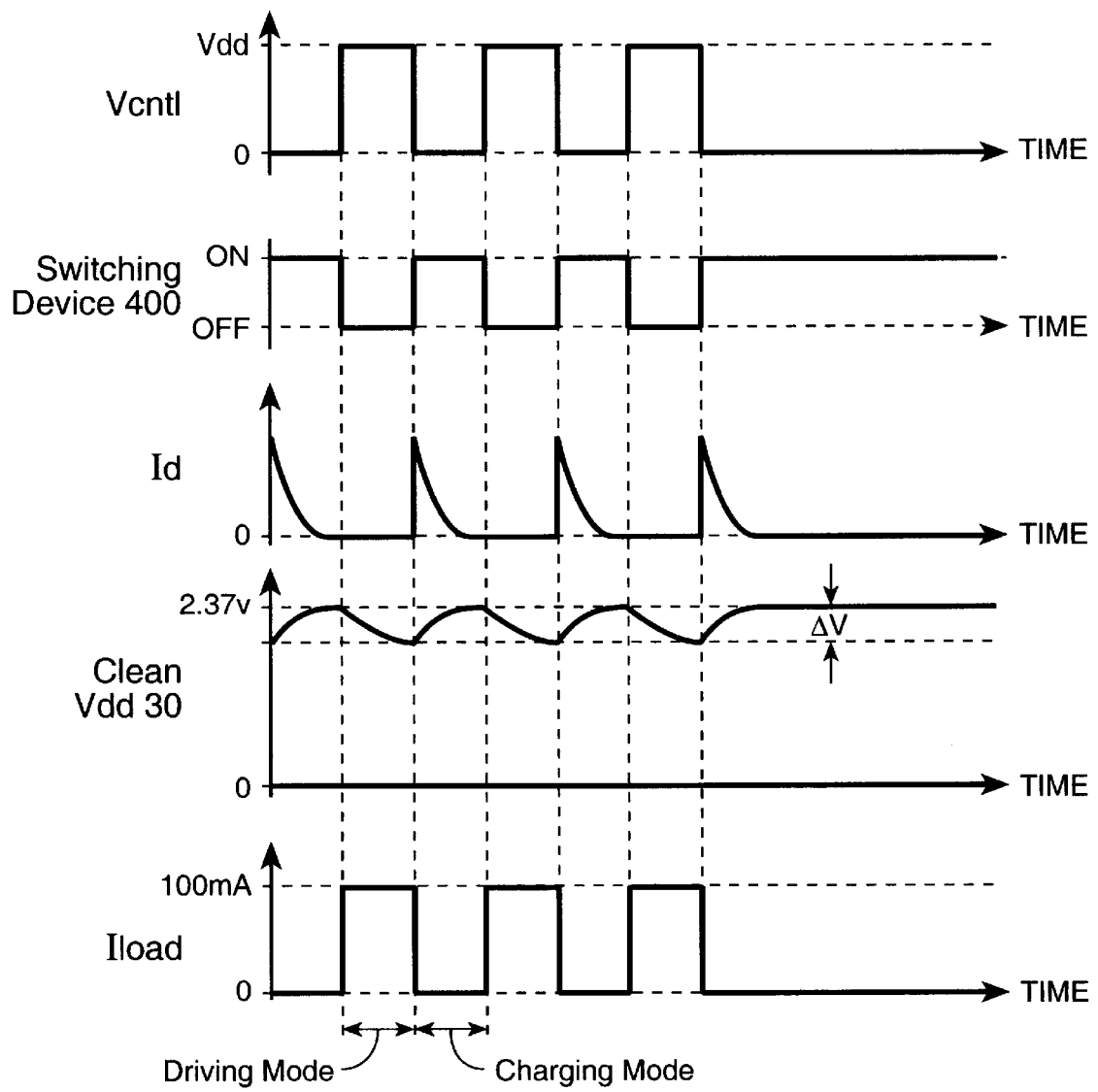
FIG._7

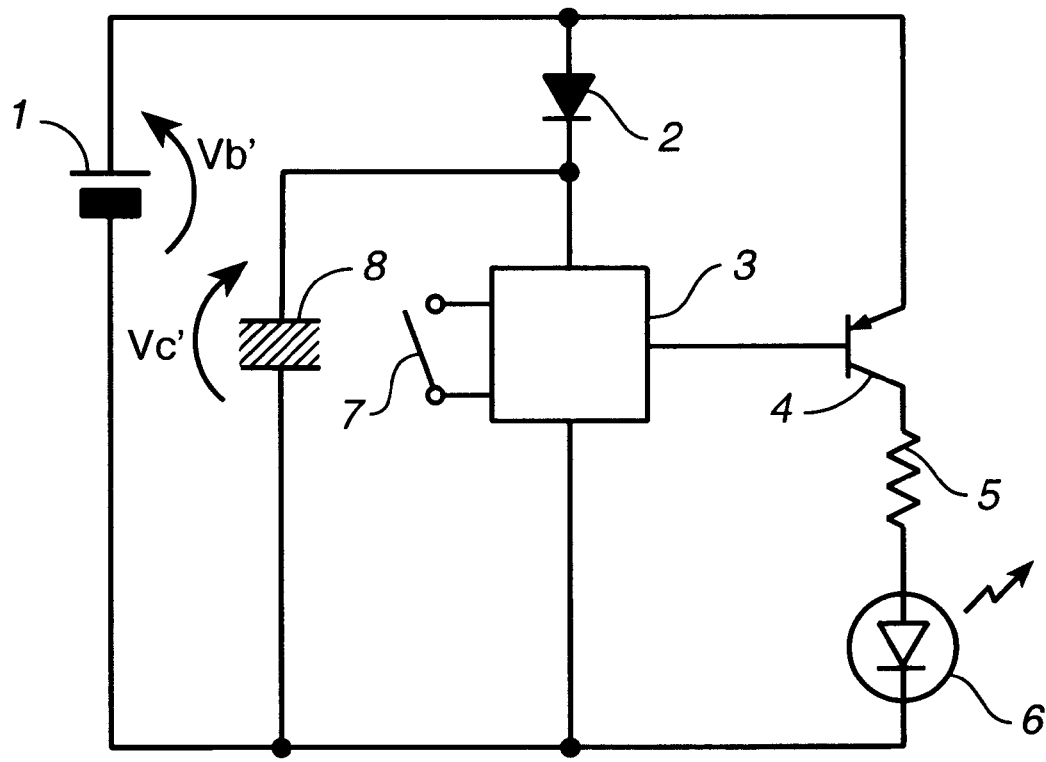
FIG._8
*(PRIOR ART)*

LOW RIPPLE POWER DISTRIBUTION SYSTEM

FIELD OF THE INVENTION

The present invention relates generally to a power distribution system, and particularly to a power distribution system for an integrated circuit including a controller and a driver.

BACKGROUND OF THE INVENTION

In recent years, as a result of the development of semiconductor process, integrated circuits often drive relatively large current loads, such as an LED (light emitting diode).

There are various devices for driving an LED by using a battery as a power supply. Japanese Laid-Open Patent Publication No. 8-23,578 (Andou et al.) shows a remote controller for driving an LED having a controller with a capacitor, and a battery. FIG. 8 shows a circuit diagram of Andou et al.'s remote controller. The capacitor 8 is connected to the Vdd and the ground of the controller 3 in order to supply power to the controller 3. A diode 2 is provided between an anode of the battery 1 and a positive electrode of the capacitor 8. The diode 2 connects the battery 1 to the controller 3 when a battery voltage Vb' is larger than a capacitor voltage Vc' by 0.6 V, which is forward voltage of the diode 2. Otherwise, the diode 2 disconnects the battery 1 from the controller 3. Based on an operating switch 7, the controller 3 switches a transistor 4 which drives an LED 6. A resistor 5 limits current flowing through the transistor 4 and the LED 6.

Andou et al.'s remote controller suffers from inherent limitations. For example, due to the forward voltage of the diode 2, the capacitor voltage Vc' cannot be larger than (Vb'−0.6 V). Moreover, Andou et al.'s controller does not provide connection and disconnection between the battery 1 and the capacitor 8 based on the switching state of the controller 3. These disadvantages eliminate Andou et al.'s device as a viable alternative since the battery voltage Vb' is usually low, and thus the further lower voltage of (Vb'−0.6 V) is not desirable for efficiently supplying the controller 3. Andou et al. does not provide the connection based on the switching state of the controller 3, which is preferable in some cases.

SUMMARY OF THE INVENTION

The switching device couples a power supply to a controller and a capacitor when a driver does not supply load current to a load, and decouples the power supply from the controller and the capacitor when the driver supplies the load current to the load. Therefore, the controller is immune to the noisy power supply Vdd, thus eliminating malfunction of the controller due to voltage variations.

The present invention utilizes an active device like a field effect transistor as the switching device which couples and decouples the power supply and the capacitor. Since the active device has much less voltage drop than a device like a diode, the present invention enables the capacitor to be charged to a higher voltage. The active switching device of the present invention precisely adjusts the capacitor voltage to the power supply voltage without voltage drop of 0.6 V, thus supplying higher voltage to the controller than the circuit shown in the above-referenced publication. Remote controllers according to prior art do not enjoy this advantage since a device like a diode which is used as the switching device in the above-referenced publication has the forward voltage drop of 0.6 V.

According to one aspect of the present invention, a control electrode of the switching device receives an output of a comparator which compares the power supply voltage and the capacitor voltage. Since the switching device couples and decouples based on the power supply voltage and the capacitor voltage, the power supply is capable of charging the capacitor up to voltage Vc=Vb−Icntl·Rdson whenever the power supply voltage is higher than the capacitor voltage. Here, Vc is voltage across the capacitor; Vb is voltage across the power supply (e.g., battery); Icntl is current flowing into the controller; and Rdson is resistance of the switching device when the device is turned on. It is not necessary to monitor all the outputs of the controllers even if there are a plurality of controllers.

According to another aspect of the present invention, the control electrode of the switching device receives an output of the controller, thus enabling simple hardware implementation. Direct connection between the output of the controller and the control electrode of the switching device causes no time lag to couple and decouple the power supply and the capacitor, thus efficiently distributing power between the power supply, the capacitor, the controller, and the driver.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a circuit diagram conceptually illustrating the present invention.

FIG. 2 is an equivalent circuit of the present invention in the charging mode.

FIG. 3 is an equivalent circuit of the present invention in the driving mode.

FIG. 4 is a circuit diagram of the first embodiment of the present invention.

FIG. 5 is a waveform diagram illustrating the operation of the first embodiment of the present invention.

FIG. 6 is a circuit diagram of the second embodiment of the present invention.

FIG. 7 is a waveform diagram illustrating the operation of the second embodiment of the present invention.

FIG. 8 is a circuit diagram of a remote controller according to the prior art.

DETAILED DESCRIPTION OF THE PREFERRED EMBODIMENTS

The present invention will be described in detail with reference to the drawings, wherein like elements are referred to with like reference labels throughout.

FIG. 1 illustrates a concept of the present invention embodied in an integrated circuit, and a power distribution system including the integrated circuit. The power distribution system of the present invention includes a power supply 100, a capacitor 110, a load 120, and an integrated circuit 130. The power supply 100, the capacitor 110, and the load 120 are coupled to the integrated circuit 130 at a power supply terminal 102, a capacitor terminal 112, and a load terminal 122, respectively.

The power supply 100, which is preferably at least one battery cell, supplies DC voltage to the power supply terminal 102. The power supply 100 is preferably a battery system which includes at least one battery cell. The capacitor 110 is charged or discharged depending on the state of the switching device 400 which has resistance Rdson in the "ON" state, and the voltage of the power supply 100. The capacitor 110 is preferably an electrochemical capacitor.

The integrated circuit 130 includes a driver 200, a controller 300, and a switching device 400. The driver 200 is coupled to a "noisy" Vdd 20 in order to receive electric power necessary for driving the load 120. The noisy Vdd 20 supplies relatively noisy DC voltage with occasional voltage dips, or voltage drops. The power supply 100 also is coupled to the noisy Vdd 20 via the power supply terminal 102. The driver 200 drives the load 120 by supplying load current Iload to the load 120 via the load terminal 122 in response to a control signal Vcntl outputted by the controller 300.

The controller 300 is coupled to a "clean" Vdd 30 in order to receive electric power necessary for driving the driver 200. The clean Vdd 30 supplies relatively clean DC voltage. The capacitor 110 also is coupled to the clean Vdd 30 via the capacitor terminal 112. The controller 300 outputs the control signal Vcntl to an input of the driver 200. The controller 300 may receive an input signal at an input terminal 302 and/or send an output signal at an output terminal 304.

In this specification, the term "Vdd level" generally refers to a logic high level irrespective of the difference of the noisy Vdd 20 and the clean Vdd 30. The term "ground level" refers to the reference voltage which is supposed to have 0 (zero) V.

The switching device 400 has a control electrode 410, and two electrodes 412 and 414. The switching device 400 functions as a switch depending on a switching signal applied to the control electrode 410. For example, when the level of the switching signal is below a threshold voltage, the switching device 400 closes the electrodes 412 and 414 with the "ON" resistance Rdson. If the switching signal is above the threshold voltage, the switching device 400 opens the electrodes 412 and 414. In other words, the switching device 400 selectively couples and decouples the noisy Vdd 20 and the clean Vdd 30 in response to the switching signal applied to the control electrode 410.

The switching device 400 has two modes of operation, namely closed circuit mode, and open circuit mode. Based on the control signal applied to the control electrode 410 of the switching device 400, the power distribution system of the present invention (i) sets the switching device 400 to the closed circuit mode when the driver 200 does not supply load current to the load 120, and (ii) sets the switching device 400 to the open circuit mode when the driver 200 supplies load current to the load 120.

FIG. 2 illustrates the power distribution system of the present invention when the switching device 400 is in the closed circuit mode. The controller 300 negates the control signal Vcntl in order to deactivate the driver 200, thus disabling the driver 200 from supplying the load current Iload. The switching device 400 couples the power supply terminal 102 to the controller 300 and the capacitor terminal 112 when the load current Iload is zero. Hereinafter, the operation mode of the power distribution system in FIG. 2 is referred to as the "charging mode."

In the charging mode, the driver 200 does not supply the load current Iload to the load 120. Instead, charging current flows from the power supply 100 to the capacitor 110 via the power supply terminal 102, the switching device 400, and the capacitor terminal 112 until voltage Vc across the capacitor 110 reaches voltage (Vb−Icntl·Rdson). The driver 200 in the charging mode is equivalent to an open circuited switch which is connected between the noisy Vdd 20 and the load terminal 122. However, in the charging mode, since the load current Iload does not flow, the "noisy" Vdd 20 does not actually contain spike noise which may cause malfunction of the controller 300. Therefore, coupling the power supply terminal 102 to the controller 300 and the capacitor terminal 1 12 when the load current Iload does not flow is advantageous for charging the capacitor 110 by the power supply 100.

The power supply 100 is generally expressed by a series connection of a voltage source generating constant voltage Econst, and an internal resistance Rin, where Vb=Econst−Rin·Ib. The negative electrode of the power supply 100, and one of the electrodes of the capacitor 110 are electrically connected. Therefore, a current path along which the charging current flows contains resistance Rin, and capacitance of the capacitor 110. This series connection of the resistance and the capacitance advantageously functions as a low pass filter which eliminates undesired high-frequency components which could cause unwanted EMI (electromagnetic interference).

FIG. 3 illustrates the power distribution system of the present invention when the switching device 400 is in the open circuit mode. The controller 300 asserts the control signal Vcntl in order to activate the driver 200, thus enabling the driver 200 to supply the load current Iload. The switching device 400 decouples the power supply terminal 102 from the controller 300 and the capacitor terminal 112 when the load current Iload flows. Hereinafter, the operation mode of the power distribution system in FIG. 3 is referred to as the "driving mode."

In the driving mode, the load current Iload flows from the power supply 100 to the load 120 via the power supply terminal 102, the noisy Vdd 20, the driver 200, and the load terminal 122. In other words, the driver 200 supplies the load current Iload to the load 120. The driver 200 in the driving mode is equivalent to a closed circuited switch which is connected between the noisy Vdd 20 and the load terminal 122.

During the driving mode, the capacitor 110 supplies the electric power consumed by the controller 300 through the capacitor terminal 112 and the clean Vdd 30. In this mode, isolation of the controller 300 from the noisy Vdd 20 enables the controller 300 to operate stably without being affected by voltage drops or spike noise on the noisy Vdd 20 caused by the large load current Iload flowing through the load 120. The controller 300, which is typically a noise-sensitive core circuit in the integrated circuit 130, functions properly irrespective of the voltage fluctuation on the noisy Vdd 20 during the driving mode.

FIG. 4 illustrates the first embodiment of the integrated circuit and the power distribution system according to the present invention. In this embodiment, the switching device 400 is a PMOS FET (p-type metal oxide semiconductor field effect transistor) having a gate electrode 420, a source electrode 422, a drain electrode 424, and a body diode 426 which is inherent to a MOS FET. The gate electrode 420, the source electrode 422, and the drain electrode 424 correspond to the control electrode 410, the electrodes 412, and 414, respectively.

A comparator 500 receives the voltages Vb and Vc at an inverting input 502 and a non-inverting input 504, respectively. The comparator 500 compares the voltages Vb and Vc, and sets an output 506 to a desired voltage level based on the comparison. Specifically, the comparator 500 pulls the output 506 up to the Vdd level when Vb<Vc, when the driver 200 supplies the load current Iload to the load terminal 122. On the contrary, the comparator 500 pulls the output 506 down to the ground level when Vb≧Vc, when the driver 200 does not supply the load current Iload to the load terminal 122.

As a result, the switching device 400 couples the power supply terminal 102 to the controller 300 and the capacitor terminal 112 when Vb >Vc, i. e., when the driver 200 does not supply the load current Iload to the load terminal 122. The switching device 400 decouples the power supply terminal 102 from the controller 300 and the capacitor terminal 112 when Vb<Vc, i.e., when the driver 200 supplies the load current Iload to the load terminal 122.

The switching device 400 is preferably a MOS FET because the body diode 426 inherent to a MOS FET enables the charging current into the capacitor 110 to flow therethrough, when the comparator 500 is not capable of turning on the switching device 400 during start-up, as described in detail below. At the start-up period, when the power supply 100 begins supplying the voltage Vb to the power supply terminal 102, the capacitor 110 stores no charge, and thus the voltage Vc, i.e., the voltage at the clean Vdd 30, is zero.

The comparator 500 receives electric power for driving the gate electrode 420 from the clean Vdd 30, not from the noisy Vdd 20, because the comparator 500 deals with small input signals. Thus, the comparator 500 receives no electric power from the clean Vdd 30 to drive the switching device 400 during the start-up period. The body diode 426 functions as a bypass, which allows the charging current of the capacitor 110 to flow therethrough when the switching device 400 remains turned off during the start-up period, thus enabling start-up of the whole circuit without an additional start-up circuitry.

However, it will be appreciated that during the driving mode, the body diode 426 keeps decoupling the power supply terminal 102 from the controller 300 and the capacitor terminal 112 as long as Vc≧Vb−Icntl·Rdson because the voltage difference of the noisy Vdd 20 and the clean Vdd 30 is reversely biasing the body diode 426. The body diode 426 remains turned off except for the transient start-up period described in the preceding paragraph.

The switching device 400 is preferably a PMOS FET because the PMOS FET is turned on by negative voltage applied to the gate electrode 420 with respect to the source electrode 422. This negative voltage is generated by pulling the gate electrode 420 down to the ground potential by the comparator 500. On the contrary, an NMOS FET can be used for the switching device 400 as long as the gate electrode 420 is selectively set to a voltage potential higher than that of the source electrode 422.

FIG. 5 shows waveforms of (i) the control signal Vcntl, (ii) the signal V506 at the output 506 of the comparator 500, (iii) the noisy Vdd 20, and (iv) the clean Vdd 30. The horizontal and vertical axes of FIG. 5 represent the time (2 μs/div) and the voltage (20 mV/div), respectively. It is noted that for simplicity of illustration, converted values Vcntl' and V506' are plotted in FIG. 5. The conversions are based on the following equations: Vcntl'=(Vcntl)/200+2.04 V, and V506'=(V506)/200+2.02 V. As seen from FIG. 5, the ripple of the clean Vdd 30 is less than 4 mV peak-to-peak, while the ripple of the noisy Vdd 20 is more than 120 mV. Voltage difference Vnc represents the difference between the noisy Vdd 20 and the clean Vdd 30 during the charging mode, which is equal to (Icntl·Rdson).

In the first embodiment, the specific circuit parameters are as follows:

Voltage of Econst=2.0 V,

Internal resistance of the power supply 100 (Rin)=1.5 Ω,

Capacitance of the capacitor 110=10 μF,

Maximum of Iload=81 mA, and

Output current of the controller 300=0.89 mA.

One of the advantages of using the comparator 500 is that the power distribution system eliminates narrow voltage notches, or voltage drops on the clean Vdd 30. The clean Vdd 30 shown in FIG. 5 does not contain voltage spikes more than 4 mV peak-to-peak because the combination of the switching device 400, the comparator 500, and the capacitor 110 effectively filters the high frequency noise.

The first embodiment is advantageous especially when the integrated circuit 130 has a plurality of pairs of the driver 200 and the controller 300. Since the comparator 500 detects the voltage difference between the noisy Vdd 20 and the clean Vdd 30, the comparator 500 switches the switching device 400 only when the coupling and decoupling is necessary. In other words, the integrated circuit 130 does not have to monitor on-off states of all the plurality of drivers 200.

FIG. 6 illustrates the second embodiment of the integrated circuit and the power distribution system according to the present invention. Also in the second embodiment, the switching device 400 is a PMOS FET. The switching signal applied to the control electrode 420 is generated from the control signal Vcntl outputted from the controller 300. The second embodiment is utilized for, for example, a remote controller which emits pulse-modulated infrared light from the load 120.

The driver 200 includes an NPN transistor 210, and a base resistor 220. When the control signal Vcntl is at the Vdd level, the transistor 210 is turned on, thus supplying the load current Iload to the load 120. The load 120 is an IR LED (infrared light emitting diode) 124. When the control signal Vcntl is at the ground level, the transistor 210 is turned off, thus keeping the load current Iload zero.

The controller 300 includes an NMOS FET 310 and a PMOS FET 320 connected to form a totem pole type buffer. When the input terminal 302 is set to the Vdd level, the NMOS FET 310 is turned on, and the PMOS FET 320 is turned off, thereby setting the control signal Vcntl to the Vdd level. On the contrary, when the input terminal 302 is set to the ground level, the NMOS FET 310 is turned off, and the PMOS FET 320 is turned on, thereby setting the control signal Vcntl to the ground level. The input 302 of the controller 300 receives a pulse signal which is generated by another circuitry located whether inside or outside the integrated circuit 130. A capacitor 111 is connected in parallel with the capacitor 110 in order to bypass noise on the clean Vdd 30 having relatively high frequency components.

FIG. 7 shows waveforms of (i) the control signal Vcntl, (ii) state of the switching device 400, (iii) drain current Id, (iv) the clean Vdd 30, and (v) the load current Iload. The horizontal and vertical axes of FIG. 7 represent the time and the voltage, respectively. The charging mode and the driving mode of the second embodiment of FIG. 6 is now described referring to FIG. 7.

The controller 300 generates the control signal Vcntl to transmit pulse-modulated infrared light from the IR LED 124. When the user pushes a button of the remote controller, the controller 300 encodes the information related with the button, and outputs a sequence of pulses based on the encoded data. The frequency of the pulse sequence ranges from 50 kHz to 500 kHz. When the user does not push any button of the controller, no pulses of infrared light are emitted from the IR LED 124.

In the charging mode, the control signal Vcntl is at the ground level. Thus, the switching device 400 is turned on, thereby coupling the power supply terminal 102 to the controller 300 and the capacitor terminal 112. In this mode, the drain current Id, or the charging current flows from the power supply 100 to the capacitor 110 via the power supply terminal 102, the switching device 400, the capacitor terminal 112. The drain current Id exponentially decreases as the capacitor 110 is charged. The voltage of the clean Vdd 30 exponentially increases and ultimately saturates at the level of the noisy Vdd 20. The load current Iload does not flow from the power supply 100 to the load 120 during the charging mode.

Therefore, the switching device 400 couples the power supply terminal 102 to the controller 300 and the capacitor terminal 112 in the charging mode, when the driver 200 does not supply the load current Iload to the load terminal 122.

In the driving mode, the control signal Vcntl is at the Vdd level. Thus, the switching device 400 is turned off, thereby decoupling the power supply terminal 102 from the controller 300 and the capacitor terminal 112. In this mode, the drain current Id does not flow. The voltage of the clean Vdd 30 exponentially decreases as the capacitor 110 discharges to supply electric power to the controller 300. The load current Iload flows from the power supply 100 to the load 120 via the power supply terminal 102, the driver 200, the load terminal 122 during the driving mode.

Thus, the switching device 400 decouples the power supply terminal 102 from the controller 300 and the capacitor terminal 1 12 in the driving mode when the driver 200 supplies the load current Iload to the load terminal 122.

In the second embodiment, the specific circuit parameters are as follows:

Voltage of Vb=2.37 V (Two of AAA battery cells),

Capacitance of the capacitor 110=100 µF,

Capacitance of the capacitor 111=100 nF,

Maximum of Iload=100 mA,

Output current of the controller 300=1.10 mA, and

Maximum of Rdson of the switching device 400=10 Ω

(at Vgs=−5 V, Id=−100 mA), wherein

Rdson=Resistance between drain and source when MOS FET is turned on,

Vgs=Voltage between gate and source of MOS FET, and

Id=Drain current.

The fluctuation ΔV of the clean Vdd indicated in FIG. 7 is less than 5 mV.

The capacitance C of the capacitor 110 is preferably determined by the following considerations. Supposing that the capacitor 110 supplies charge only to the controller 300, which consumes Icc (A), and that duration of the driving mode is Δt (s), then the capacitance C necessary for keeping the fluctuation within a desired value Δv is expressed as follows:

$$C = Icc \cdot \Delta t / \Delta v$$

For example, if Icc=10 mA, Δt=50 µs, and Δv=5 mV, then C is 100 µF.

The term "terminal" used in the specification includes, for example, an input/output pad on a semiconductor chip, a discrete electronic part as a terminal, a point (or, node) on a conductive pattern laid out on a printed circuit board, and a point in a lead wire. Therefore, a device or a circuitry wherein the power supply 100, the capacitor 1 10, and the load 120 are electrically connected to the electrodes 414, 412, and the output of the driver 200, respectively without separate discrete terminals or pads is within the scope of the present invention.

The term "couple" used in this specification includes electrical connection via a parasitic (or, inherent) circuit element like resistance due to a printed circuit pattern, and an additional circuit element, such as a bias resistor, a coupling capacitor, and an RF choke coil. Therefore, in this specification, a switching device "couples" a power supply terminal and a capacitor terminal even if there exists an intervening circuit element, such as resistance and inductance of a printed circuit pattern between the two terminals, and a discrete electronic part.

Each of the functional blocks of the present invention, such as the load 120, the driver 200, the controller 300, and the switching device 400, may contain other elements, whether inherent, discrete, or integrated. For example, the driver 200 may include biasing/current-limiting resistors. Also, the integrated circuit and the power distribution system of the invention may have, for example, a plurality of drivers to replace the single driver 200. Similarly, the integrated circuit and the power distribution system of the invention may have a plurality of controllers to replace the single controller 300. Also, the single switching device 400 can be replaced with a plurality of switching devices connected in parallel with each other in order to, for example, reduce the total drain-source resistance Rdson, or increase the total current flowing through the switching devices.

The integrated circuit 130 of the present invention including the driver 200, the controller 300, and the switching device 400 is preferably manufactured on a single semiconductor chip. In the preferred embodiment, the controller 300 is a core circuit of the integrated circuit 130, and the power supply terminal 102, the capacitor terminal 112, and the load terminal 122 are implemented as pads, which are preferably provided in a peripheral area of the semiconductor chip. The pads which function as the power supply terminal 102, the capacitor terminal 112, and the load terminal 122 are preferably have wires bonded thereon for electrically connecting to pins on an integrated circuit package.

Preferably, the capacitor 110 and the integrated circuit 130 are mounted on a printed circuit board. However, the integrated circuit 130 can be manufactured on different semiconductor chips. Alternatively, part of, or all of, the capacitor 110, the load 120, and the integrated circuit 130 may be implemented as a hybrid IC, or implemented by discrete circuit components.

The current flow direction of the load current Iload can be the opposite to one shown in FIGS. 3, 4 and 6. For example, in FIG. 3, the driver 200 pulls the load terminal 122 up to the level of the noisy Vdd 20 when the driver 200 supplies the load current Iload to the load 120 However, the driver 200 may pull the load terminal 122 down to the ground level. In this case, one of the terminals of the load 120 is coupled to the noisy Vdd 20 so that the load current Iload flows from the noisy Vdd 20 to the ground through the load 120, the load terminal 122, and the driver 200. In other words, the drivers 200 may function as a current sink.

The polarity of the control signal Vcntl is determined based on which of active-low (or, negative logic) and active-high (or, positive logic) the controller 300 uses, and the input polarity of the driver 200. For example, if the controller 300 is an active-low device, and the input of the driver 200 is an inverting input, then the control signal Vcntl having low level allows the driver 200 to output the load current Iload to the load 120.

While the present invention is described in illustrative embodiments where a MOS FET is utilized as the switching device 400, the switching device 400 may be a bipolar transistor, a junction FET, and a thyristor, such as an SCR (silicon controlled rectifier), a GTO (gate turn-off thyristor), an MCT (MOS-controlled thyristor). Therefore, the control electrode 420 of the switching device 400 may be a base, or a gate according to the specific device used.

The load 120 is preferably an LED. However, it will be appreciated that the load 120 can be other types of load which consumes much current. The examples of the load 120 include a coil, an electromagnetic relay, a solid-state relay, a motor, a piezoelectric actuator, and a light bulb.

It is to be understood that while the invention has been described above in conjunction with preferred specific embodiments, the description and examples are intended to illustrate and not limit the scope of the invention, which is defined by the scope of the appended claims.

What is claimed is:

1. An integrated circuit having a power supply terminal for connecting to a power supply, a capacitor terminal for connecting to a capacitor, and a load terminal, comprising:

a driver, connected to the power supply terminal which supplies load current to said load terminal in response to a control signal;

a controller which generates said control signal, said controller being coupled to said capacitor terminal; and a switching device having a control electrode which receives a switching signal in order to
   couple said power supply terminal to said controller and said capacitor terminal when said driver does not supply said load current to said load terminal, and
   decouple said power supply terminal from said controller and said capacitor terminal when said driver supplies said load current to said load terminal.

2. The integrated circuit of claim 1, further comprising a comparator which compares a first voltage at said power supply terminal, and a second voltage at said capacitor terminal, and outputs a comparator signal based on the comparison, wherein said switching signal is generated from said comparator signal.

3. The integrated circuit of claim 2, wherein said switching device is a PMOS FET.

4. The integrated circuit of claim 3, wherein said driver, said controller, said switching device, and said comparator are manufactured on a semiconductor chip.

5. The integrated circuit of claim 1, wherein said switching signal is generated from said control signal.

6. The integrated circuit of claim 5, wherein said switching device is a PMOS FET.

7. The integrated circuit of claim 6, wherein said driver, said controller, and said switching device are manufactured on a semiconductor chip.

8. A power distribution system comprising:

a load;

a driver which supplies load current to said load in response to a control signal;

a power supply which supplies a first voltage to said driver;

a controller which generates said control signal;

a capacitor which supplies a second voltage to said controller; and a switching device having a control electrode which receives a switching signal in order to
   couple said power supply to said controller and said capacitor when said driver does not supply said load current to said load, and
   decouple said power supply from said controller and said capacitor when said driver supplies said load current to said load.

9. The system of claim 8, further comprising a comparator which compares said first voltage and said second voltage, and outputs a comparator signal based on the comparison, wherein said switching signal is generated from said comparator signal.

10. The system of claim 9, wherein said switching device is a PMOS FET.

11. The system of claim 10, wherein said driver, said controller, said switching device, and said comparator are manufactured on a semiconductor chip.

12. The system of claim 1 1, wherein said power supply is at least one battery cell.

13. The system of claim 12, wherein said load is an LED.

14. The system of claim 8, wherein said switching signal is generated from said control signal.

15. The system of claim 14, wherein said switching device is a PMOS FET.

16. The system of claim 15, wherein said driver, said controller, and said switching device are manufactured on a semiconductor chip.

17. The system of claim 16, wherein said power supply is at least one battery cell.

18. The system of claim 17, wherein said load is an LED.

* * * * *